United States Patent
Yagi et al.

(10) Patent No.: US 6,674,005 B2
(45) Date of Patent: Jan. 6, 2004

(54) ELECTROMAGNETIC SHIELDING STRUCTURE FOR ELECTRIC WIRE

(75) Inventors: Sakai Yagi, Haibara-gun (JP); Hirotaka Fukushima, Haibara-gun (JP); Hidehiko Kuboshima, Haibara-gun (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 10/260,296

(22) Filed: Oct. 1, 2002

(65) Prior Publication Data
US 2003/0062177 A1 Apr. 3, 2003

(30) Foreign Application Priority Data
Oct. 1, 2001 (JP) ..................... P2001-305798

(51) Int. Cl.⁷ .......................... H02G 3/00; H01B 11/06; H05K 9/00
(52) U.S. Cl. .................. 174/72 A; 174/35 R; 174/135; 138/123; 361/818
(58) Field of Search .............................. 174/35 R, 35 C, 174/35 MS, 68.1, 68.3, 72 A, 135; 361/816, 818, 826; 138/123

(56) References Cited

U.S. PATENT DOCUMENTS

| | | | | |
|---|---|---|---|---|
| 3,772,718 A | * | 11/1973 | Williams | ............... 441/133 |
| 4,433,206 A | * | 2/1984 | Lewis | ............... 174/35 C |
| 4,695,712 A | * | 9/1987 | Busch | ............... 219/535 |
| 4,871,883 A | * | 10/1989 | Guiol | ............... 174/36 |
| 5,012,125 A | * | 4/1991 | Conway | ............... 307/149 |
| 5,504,274 A | * | 4/1996 | McCabe et al. | ............... 174/36 |
| 5,642,248 A | * | 6/1997 | Campolo et al. | ............... 361/42 |
| 6,439,929 B1 | * | 8/2002 | Jenets | ............... 439/610 |

\* cited by examiner

Primary Examiner—Dean A. Reichard
Assistant Examiner—Adolfo Nino
(74) Attorney, Agent, or Firm—Sughrue Mion, PLLC

(57) ABSTRACT

A bundle of electric wires has a first length and a first diameter. A tubular braided wire has a second length which is shorter than the first length and a second diameter which is larger than the first diameter. The bundle of electric wires is passed through the braided wire, and then a connector is connected to each of both ends of the electric wires collectively. The connector having a third diameter which is larger than the first diameter. The braided wire is stretched such that both ends thereof are fixed on the respective connectors to form a reduced-diameter portion therebetween which is fitted on an outer periphery of the bundle of the electric wire. A conductive retainer is attached on the reduced-diameter portion to maintain a length and a diameter of the reduced-diameter portion.

6 Claims, 3 Drawing Sheets

ELECTROMAGNETIC SHIELDING STRUCTURE FOR ELECTRIC WIRE

BACKGROUND OF THE INVENTION

This invention relates to an electromagnetic shielding structure for covering a wire/cable or a wire harness, connected to I/O terminals of a motor on an electric car, or to I/O terminals of an ordinary electronic/electrical equipment so as to achieve the electromagnetic shielding thereof.

In recent years, weak-current circuits and electronic circuits have increasingly been used in automobiles, and installation wires have been formed into a large-current/high-voltage design, and under the circumstances it has been required to provide effective and inexpensive electromagnetic shielding means which protect the weak-current circuits (which can be easily affected by electromagnetic noises), and prevent the precision of detection by various sensors in the electronic circuits from being lowered by adverse effects of electromagnetic noises.

For example, in the case of a motor mounted on an electric car, it has been required to provide effective electromagnetic shielding means which prevent adverse effects of electromagnetic waves, generated from large-current/high-voltage power wire or cable, on external equipments, and prevent adverse effects of electromagnetic waves from the exterior.

In a structure shown in FIG. 4, a braided wire 14, formed by interweaving electrically-conductive metal wire elements into a tubular shape, is fitted on a bundle of wires 10 to cover the same, and this braided wire 14 is connected to a tubular metal shell 15 serving as a conductive shielding terminal, and the metal shell 15 is connected at its flange 15a to a mounting member, such for example as an outer casing B of a motor, by bolts 16. A distal end portion 14a of the braided wire 14 is press-fitted with an outer surface of the metal shell 15 over an entire periphery thereof by a fixing band 17 fastened by pressing to the distal end portion 14a. Metal terminals 13 are fastened by pressing respectively to conductors 11, exposed respectively at distal end portions of the wires 10, and the wire end portions, each having the metal terminal 13 connected thereto, are passed through a wire lead-in port b1 formed through the outer casing B, and the metal terminals 13 are connected to I/O terminals of the motor by respective bolts, thereby making electrical connection therebetween. In this case, the outer casing B is connected to the ground G, so that there is formed a shielding short-circuit path from the braided wire 14 to the ground G via the metal shell 15 and the outer casing B, thereby absorbing electromagnetic waves generated from the wires 10.

The braided wire 14 of the known type is formed by interweaving the above-mentioned metal wire elements, and there is another known type in which copper-plated strands are spirally wound on resin (e.g. polyester) strands to form meshwork wire elements, and these wire elements are interwoven into a tubular shape.

The braided wire 14, used in the electromagnetic shielding structure of FIG. 4, has the following problems.

In the manufacturing process, the long wires 10 are passed through the braided wire 14, and in this case the tubular braided wire 14, having a sufficiently large outer diameter, is used so that the insertion can be easily effected so as to enhance the efficiency of the operation. However, to use the braided wire 14 of a large diameter, having a length corresponding to the length of the wires 10, is costly, and therefore is disadvantageous.

In the case where the diameter of the braided wire 14 is thus sufficiently large, the plurality of wires 10 rub together within the braided wire upon vibration of a vehicle body, and therefore there is encountered a disadvantage that covering members 12 of the wires 10 are worn, so that the durability of the covering members 12 are adversely affected.

In connection with the above, in the case where a sufficient space is formed between the inner surface of the braided wire 14 and the wires 10, the non-conductive portions are liable to develop, so that the satisfactory electromagnetic shielding performance can not be obtained.

SUMMARY OF THE INVENTION

It is therefore an object of the invention to provide an electromagnetic shielding structure which can achieve a required shielding performance against electromagnetic waves generated particularly from installed large-current/high-voltage wires, and can meet variations in the size (such as a diameter) and number of wires of different kinds.

In order to achieve the above object, according to the present invention, there is provided a method of manufacturing an electromagnetic shielding structure for electric wires, comprising the steps of:

providing a bundle of electric wires having a first length and a first diameter;

providing a tubular braided wire having a second length which is shorter than the first length and a second diameter which is larger than the first diameter;

passing the bundle of electric wires through the braided wire;

connecting a connector to each of both ends of the electric wires collectively, the connector having a third diameter which is larger than the first diameter;

stretching the braided wire such that both ends thereof are fixed on the respective connectors to form a reduced-diameter portion therebetween which is fitted on an outer periphery of the bundle of the electric wire; and attaching a conductive retainer on the reduced-diameter portion to maintain a length and a diameter of the reduced-diameter portion.

Preferably, the second length and the second diameter are determined such that the diameter of the reduced-diameter portion becomes substantially equal to the first diameter when the braided wire is stretched.

According to the present invention, there is also provided an electromagnetic shielding structure for electric wires, comprising:

a bundle of electric wires, having a first diameter;

a connector, collectively connected to each of both ends of the electric wires, the connector having a second diameter which larger than the first diameter;

a tubular braided wire, in which both ends thereof are fixed on the respective connectors to form a reduced-diameter portion therebetween which is fitted on an outer periphery of the bundle of electric wires; and a conductive retainer, attached on the reduced-diameter portion to maintain a length and a diameter of the reduced-diameter portion.

In the above configurations, the operation for passing several wires through the short and wide braided wire is easy, and the braided wire can be used efficiently for several kinds of wires having different lengths and diameters, and the braided wire has the excellent general-purpose ability, and is economical. And besides, the non conductive portion of the braided wire relative to the electric wires hardly occurs, and the braided wire can absorb electromagnetic waves, generated from the wires, thereby achieving the satisfactory electromagnetic shielding performance. Furthermore, the inner surface of the braided wire is held in suitable contact with the electric wires, and therefore the wires will not rub together, and the durability of the wires against wear is enhanced.

Preferably, the retainer includes a tube member which is spirally wound on the reduced-diameter portion.

Alternatively, the retainer may include a pair of clip members which grips both end portions of the reduced-diameter portion.

Here, it is preferable that the clip members are connected by a rod member extending along the reduced-diameter portion.

In the above configurations, the outer diameter and the length of the reduced-diameter portion, formed by stretching the braided wire, can be easily maintained.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Preferred embodiments of an electromagnetic shielding structure of the present invention will now be described in detail with reference to the accompanying drawings.

Figure 1:
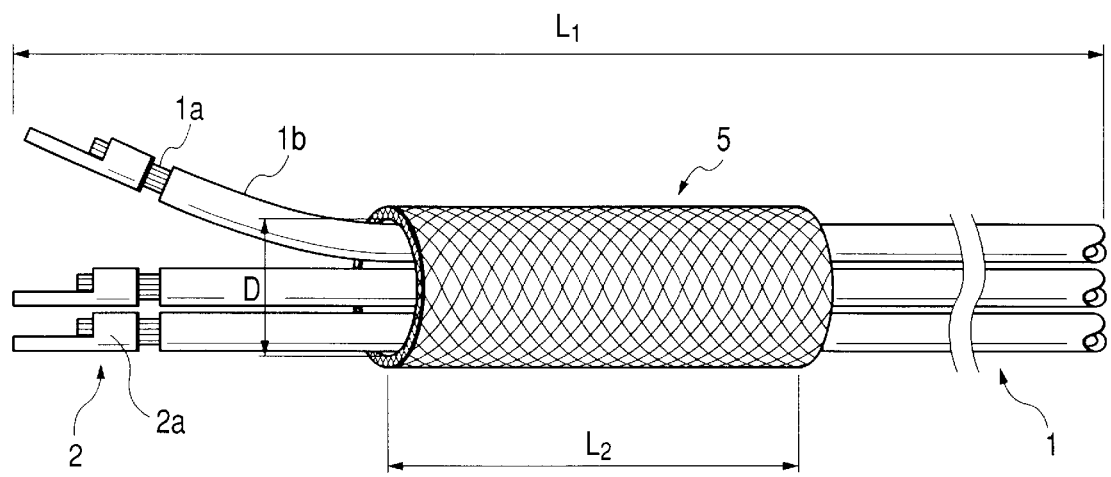
FIG. 1 is a side view showing an electromagnetic shielding structure according to a first embodiment of the invention.
Figure 4:
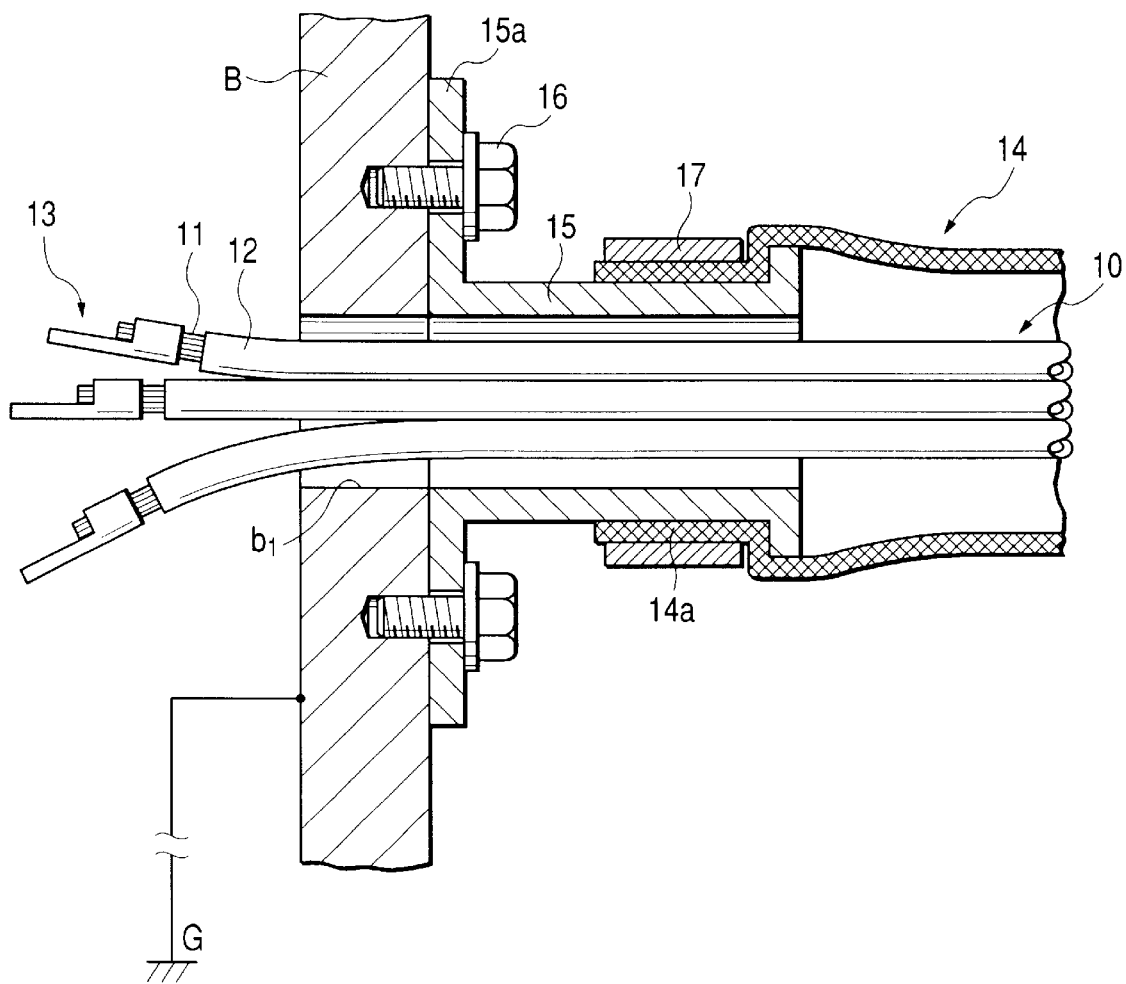
FIG. 4 is a cross-sectional view of a related-art electromagnetic shielding structure.

In a first embodiment, as shown in FIG. 1, three wires (cable) or a wire harness (hereinafter referred to as "wires 1") are installed on a vehicle body, and are connected, for example, to the I/O terminals of the motor of the electric car, shown in FIG. 4, so that these wires 1 serve as power supply wires. In this case, each wire 1 comprises a conductor 1a (such as a copper wire), and an insulating member 1b formed by extrusion on this conductor to cover it. The insulating member 1b is removed from each end portion of the wire, and a metal terminal 2, such as an LA terminal, is fastened to the exposed end portion of the conductor 1a by crimping its press-fastening portion 2a. An electric connector 3 is connected to the terminals fastened respectively to one ends of the wires 1, while an electric connector 4 are connected to the terminals fastened respectively to the other ends of the wires 1. The metal terminals 2, connected to the electric connector 3, are passed through the wire lead-in port b1, formed through the outer casing B (serving as the mounting portion) of the motor, and are connected to the I/O terminals of the motor.

At this time, in order that other equipments will not be adversely affected by electromagnetic waves produced by the high-voltage large current flowing through the wires 1, a braided wire 5 is fitted on the three wires 1, bundled together, to cover the same so as to absorb the electromagnetic waves generated from the wires 1. The opposite ends of the braided wire 5 are connected to the electric connectors 3 and 4, respectively.

The braided wire 5 of the known type is formed by interweaving electrically-conductive wire elements into a tubular shape, and there is another known type in which copper-plated strands are spirally wound on resin (e.g. polyester) strands to form meshwork wire elements, and these wire elements are interwoven into a tubular shape. The braided wire 5 of either type has such flexibility and stretchability that it can be stretched or elongated in its longitudinal direction.

Therefore, there is prepared the braided wire 5 having a length $L_2$ which is much smaller than a length $L_1$ of the wires 1 to be installed. The inner diameter of the tubular braided wire 5 is larger than the thickness of the bundle of (three) wires 1, and therefore the operation for passing the three wires 1 either one by one or at one time through the braided wire 5 can be smoothly carried out without any difficulty.

Figure 2:
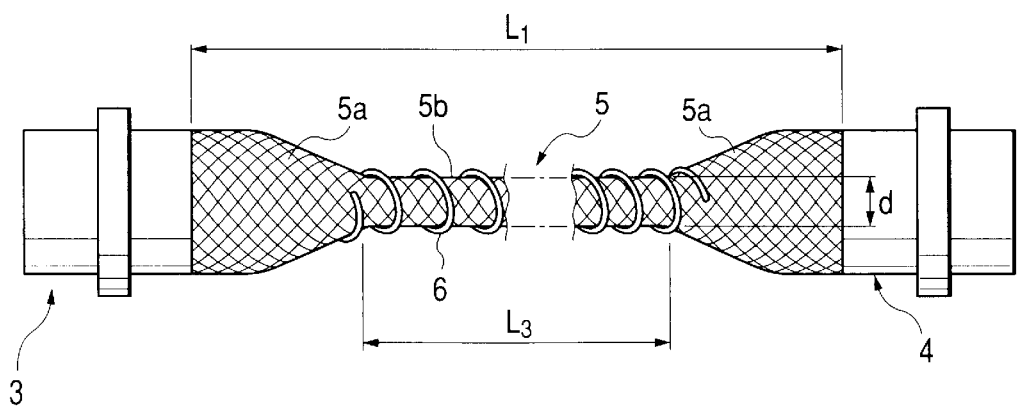
FIG. 2 is a side view of the electromagnetic shielding structure of the first embodiment, showing a condition that a spiral tube is wound on the elongated braided wire.

After the wires 1 are passed through the braided wire 5, and are set in a predetermined condition, the electric connectors 3 and 4 are connected respectively to the opposite ends of the braided wire 5, as shown in FIG. 2. One of the two connectors 3 and 4 is held against movement, and in this condition a pulling force is applied to the other electric connector, thereby stretching the braided wire 5 (having the original length $L_2$) into a length substantially equal to the length L, of the wires 1. In this manner, the braided wire 5 is elongated to form a reduced-diameter portion 5b, having a length $L_3$ and an outer diameter d, between its opposite end portions 5a which remain intact, and hence have the original inner diameter D. The reduced-diameter portion 5b is elongated into such a diameter that its inner peripheral surface is held in intimate contact or in contact with the three wires 1.

In order to maintain the length $L_3$ and the outer diameter d of the elongated, reduced-diameter portion 5b, a spiral tube 6 is mounted on the reduced-diameter portion 5b over the entire length thereof, the spiral tube 6 comprising an electrically-conductive wire rod (such as a wire) or an electrically-conductive tape spirally wound on the outer peripheral surface of the reduced-diameter portion 5b.

Thus, the predetermined length $L_3$ and outer diameter d of the reduced-diameter portion 5b can be maintained. Namely, by elongating the braided wire 5 having the original small length $L_2$, its length can be made substantially equal to the length L1 of the wires 1 of different kinds, and therefore the material cost for the braided wire can be reduced. And besides, the inner peripheral surface of the reduced-diameter portion 5b of the elongated braided wire 5 is held in contact with the three wires 1, and therefore the occurrence of the non-conductive portion can be avoided, so that the satisfactory electromagnetic shielding performance can be obtained. Furthermore, the three wires 1 are held by the reduced-diameter portion 5b fitted on these wires, and therefore the wires 1 will not rub together, and the durability of the insulating covering members of the wires 1 against wear is enhanced.

Figure 3A:
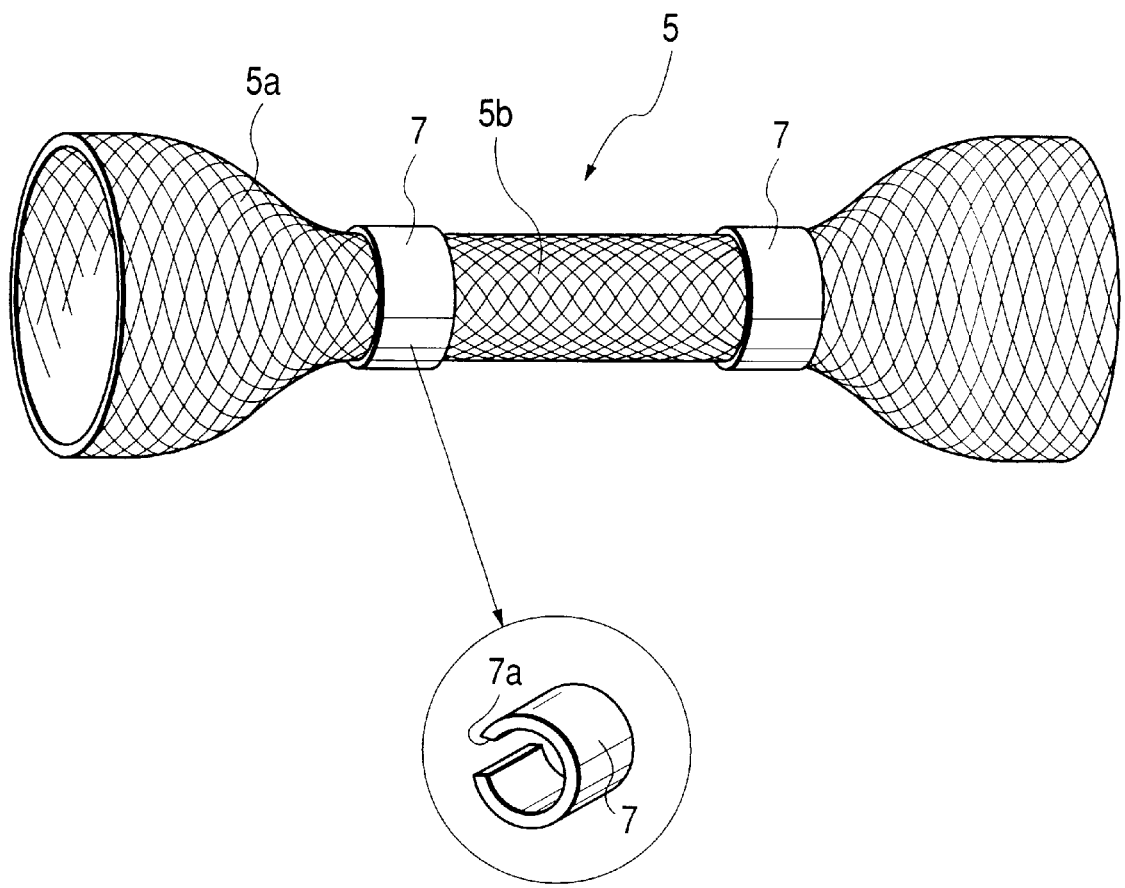
FIG. 3A is a side view of an electromagnetic shielding structure according to a second embodiment of the invention.

Instead of the spiral tube 6, according to a second embodiment of the invention, there can be used clips 7 shown in FIG. 3A. In this case, each clip of a tubular shape is formed from conductive metal or plastics material, and part of this tubular body is notched or removed to form a slit 7a, and by expanding their slits 7a, the clips are mounted respectively on the opposite end portions of the reduced-diameter portion 5b of the braided wire 5, so that the clips grip the reduced-diameter portion 5b by their resilient force, thereby fixing the reduced-diameter portion 5b to the wires 1.

Figure 3B:
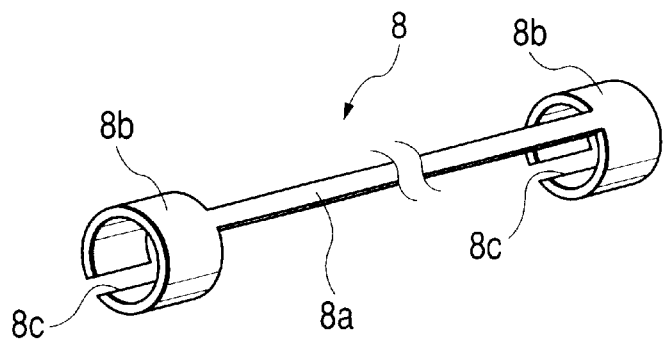
FIG. 3B is a side view of an electromagnetic shielding structure according to a third embodiment of the invention.

According to a third embodiment of the invention, the spiral tube 6 can be replaced by a conductive support rod 8 as shown in FIG. 3B. This support rod 8 includes a connecting bar 8a having a length generally equal to the length $L_3$ (see FIG. 2) of the reduced-diameter portion 5b, and this connecting bar 8a is made of metal or a plastics material having sufficient stiffness that it will not be accidentally deformed. Clip portions 8b, each having a slit 8c and having the same function as that of the clip 7 of FIG. 3A, are formed integrally at opposite ends of the connecting bar 8a, respectively. Therefore, when the clip portions 8b, formed respectively at the opposite ends of the connecting bar 8a, are mounted on the reduced-diameter portion 5b, the connecting bar 8a extends straight, thereby keeping the reduced-diameter portion 5b in its elongated condition in which the length $L_3$ and outer diameter d of this tubular reduced-diameter portion 5b are maintained.

Although the specific examples of shape retention member have been shown, the shape retention member is not limited to these examples, and any other suitable member can be used in so far as its shape and function can satisfy the technical concept of the invention.

What is claimed is:

1. A method of manufacturing an electromagnetic shielding structure for electric wires, comprising the steps of:

providing a bundle of electric wires having a first length and a first diameter;

providing a tubular braided wire having a second length which is shorter than the first length and a second diameter which is larger than the first diameter;

passing the bundle of electric wires through the braided wire;

connecting a first connector to a first end of the electric wires and a second connector to a second end of the electric wires, the connectors having a third diameter which is larger than the second diameter;

stretching the braided wire so as to have the first length, and such that both ends thereof are fitted on outer peripheries of the respective connectors to form a reduced-diameter portion therebetween which is fitted on an outer periphery of the bundle of the electric wire; and attaching a conductive retainer on the reduced-diameter portion to maintain a length and a diameter of the reduced-diameter portion.

2. The manufacturing method as set forth in claim 1, wherein the second length and the second diameter are determined such that the diameter of the reduced-diameter portion becomes substantially equal to the first diameter when the braided wire is stretched.

3. An electromagnetic shielding structure for electric wires, comprising:

a bundle of electric wires, having a first diameter;

a first connector, connected to a first end of the electric wires and a second connector connected to the second end of the electric wires, the connectors having a second diameter which is larger than the first diameter;

a tubular braided wire, including two ends thereof that are fixed on the respective connectors and a lengthwise stretched, reduced-diameter portion therebetween which is fitted on an outer periphery of the bundle of electric wires; and a conductive retainer, attached on the reduced-diameter portion to maintain a length and a diameter of the reduced-diameter portion.

4. The electromagnetic shielding structure as set forth in claim 3, wherein the retainer includes a tube member which is spirally wound on the reduced-diameter portion.

5. The electromagnetic shielding structure as set forth in claim 3, wherein the retainer includes a pair of clip members which grips both end portions of the reduced-diameter portion.

6. The electromagnetic shielding structure as set forth in claim 5, wherein the clip members are connected by a rod member extending along the reduced-diameter portion.

* * * * *